US012754242B2

(12) United States Patent
Song et al.

(10) Patent No.: US 12,754,242 B2
(45) Date of Patent: Oct. 6, 2026

(54) POWER BANK HAVING FUNCTION FOR PROVIDING RECHARGEABLE RANGE OF BATTERY PACK, BATTERY PACK CHARGING SYSTEM COMPRISING SAME, AND METHOD THEREFOR

(71) Applicant: LG ENERGY SOLUTION, LTD., Seoul (KR)

(72) Inventors: Kee Hoon Song, Daejeon (KR); Jun Suk Kim, Daejeon (KR); Hyo Seong An, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 514 days.

(21) Appl. No.: 18/270,161

(22) PCT Filed: Oct. 26, 2022

(86) PCT No.: PCT/KR2022/016501
§ 371 (c)(1),
(2) Date: Jun. 28, 2023

(87) PCT Pub. No.: WO2023/075427
PCT Pub. Date: May 4, 2023

(65) Prior Publication Data

US 2024/0085482 A1 Mar. 14, 2024

(30) Foreign Application Priority Data

Oct. 28, 2021 (KR) ........................ 10-2021-0145885

(51) Int. Cl.
*G01R 31/367* (2019.01)
*G01R 31/371* (2019.01)
*G01R 31/3835* (2019.01)

(52) U.S. Cl.
CPC ......... *G01R 31/367* (2019.01); *G01R 31/371* (2019.01); *G01R 31/3835* (2019.01)

(58) Field of Classification Search
CPC ........................... G01R 31/367; G01R 31/371; G01R 31/3835; G01R 31/382; H02J 7/00036;
(Continued)

(56) References Cited

U.S. PATENT DOCUMENTS

| | | | | |
|---|---|---|---|---|
| 10,298,039 | B2 | 5/2019 | Edgar et al. | |
| 2015/0256006 | A1* | 9/2015 | Baek | H02J 7/0031 320/136 |

(Continued)

FOREIGN PATENT DOCUMENTS

| | | | | |
|---|---|---|---|---|
| GB | 2466561 A * | 6/2010 | | G01D 7/02 |
| JP | 2004-120855 A | 4/2004 | | |

(Continued)

OTHER PUBLICATIONS

Machine translation of KR20160115229A (Year: 2016).*
(Continued)

*Primary Examiner* — Lee E Rodak
*Assistant Examiner* — Sangkyung Lee
(74) *Attorney, Agent, or Firm* — Birch, Stewart, Kolasch & Birch, LLP

(57) ABSTRACT

The present invention relates to a power bank having a function of providing a chargeable range of a battery pack, a battery pack charging system including the same, and a method therefor, and more particularly, to a battery pack charging system that provides information on how far the battery pack can be charged with charging power of the power bank through data communication between the power bank and the battery pack charged by receiving charging power from the power bank.

19 Claims, 3 Drawing Sheets

(58) Field of Classification Search
CPC ......... H02J 7/0048; H02J 7/342; Y02E 60/10; Y10S 320/21
See application file for complete search history.

(56) References Cited

U.S. PATENT DOCUMENTS

| | | | |
|---|---|---|---|
| 2016/0229302 | A1 | 8/2016 | Lee |
| 2020/0136422 | A1 | 4/2020 | Lee et al. |
| 2021/0286917 | A1 | 9/2021 | Bounilkov et al. |

FOREIGN PATENT DOCUMENTS

| | | | | | |
|---|---|---|---|---|---|
| JP | 2013064922 | A | * | 4/2013 | |
| JP | 2018-170815 | A | | 11/2018 | |
| JP | 2021-168045 | A | | 10/2021 | |
| KR | 10-2007-0117260 | A | | 12/2007 | |
| KR | 101311592 | B1 | * | 9/2013 | ........ H01M 8/04597 |
| KR | 10-1501031 | B1 | | 3/2015 | |
| KR | 10-1561069 | B1 | | 10/2015 | |
| KR | 10-2015-0142216 | A | | 12/2015 | |
| KR | 10-2016-0022179 | A | | 2/2016 | |
| KR | 10-1617581 | B1 | | 5/2016 | |
| KR | 10-1646207 | B1 | | 8/2016 | |
| KR | 20160115229 | A | * | 10/2016 | ................ H02J 7/00 |
| KR | 10-1746139 | B1 | | 6/2017 | |
| KR | 10-2019-0084685 | A | | 7/2019 | |
| KR | 10-2020-0016732 | A | | 2/2020 | |
| WO | WO 2018/129972 | A1 | | 7/2018 | |
| WO | WO 2019/240245 | A1 | | 12/2019 | |

OTHER PUBLICATIONS

Machine translation of JP2013064922A (Year: 2013).*
Machine translation of KR101311592B1 (Year: 2013).*
International Search Report for PCT/KR2022/016501 (PCT/ISA/210) mailed on Feb. 14, 2023.
Extended European Search Report for European Application No. 22887623.1, dated Jun. 6, 2024.

* cited by examiner

Fig. 2

| Table | | |
|---|---|---|
| OCV | capacity | SOC |
| 3.0V | 0Ah | 0% |
| 3.1V | 1Ah | 10% |
| 3.2V | 2Ah | 20% |
| 3.3V | 3Ah | 30% |
| 3.4V | 4Ah | 40% |
| 3.5V | 5Ah | 50% |
| 3.6V | 6Ah | 60% |
| 3.7V | 7Ah | 70% |
| 3.8V | 8Ah | 80% |
| 3.9V | 9Ah | 90% |
| 4.0V | 10Ah | 100% |

POWER BANK HAVING FUNCTION FOR PROVIDING RECHARGEABLE RANGE OF BATTERY PACK, BATTERY PACK CHARGING SYSTEM COMPRISING SAME, AND METHOD THEREFOR

CROSS REFERENCE TO RELATED APPLICATIONS

This application is the National Phase of PCT/KR2022/016501 filed on Oct. 26, 2022, which claims priority under 35 U.S.C. § 119 (a) to Patent Application No. 10-2021-0145885 filed in the Republic of Korea on Oct. 28, 2021, all of which are hereby expressly incorporated by reference into the present application.

TECHNICAL FIELD

The present invention relates to a battery pack charging system and a method therefor, and more particularly, to a power bank having a function of providing a chargeable range of a battery pack, and the battery pack charging system including the same, and the method thereof.

BACKGROUND ART

Recently, as the number of people who enjoy camping increases, the demand for a power bank is increasing to use an electronic device in outdoor environments where an electric outlet is not available. In addition, an auxiliary battery is widely used to charge and use various electronic devices including a mobile phone and a notebook computer.

In order to prevent a sudden unusable situation from occurring due to battery exhaustion of the electronic device in outdoor environments, it is important to predict and use how much the power bank or auxiliary battery can charge the electronic device that a charging counterpart.

However, in the case of most current power banks and auxiliary batteries, only the remaining capacity information of the power bank or auxiliary battery is provided through an external LED, and information on how far the charging target (electronic device) can be charged with the current power of the power bank or auxiliary battery is not provided. Accordingly, the user is using the power bank and the auxiliary battery depending on empirical rough information (LED) without knowing exact information about chargeable capacity of the charging counterpart and accordingly, a problem accompanied by inconvenience and anxiety occurs in the process of using it.

As such prior art, there is a following patent document.

Patent literature 1: KR 1561069 B1

DISCLOSURE OF THE INVENTION

Technical Problem

The present invention is intended to solve the problems described above, and is to provide information on how far the charging counterpart can be charged through an external display of the power bank (auxiliary battery) based on the remaining capacity of the power bank (auxiliary battery) and the current capacity of the charging counterpart after checking the capacity information through communication between the power bank (auxiliary battery) and the charging counterpart.

Technical Solution

The present invention provides a battery pack charging system including a power bank and a battery pack configured to be charged by receiving charging power from the power bank, in which the power bank and the battery pack each include a communication unit for mutual data communication, and a battery management system (BMS) of the power bank receives measured capacity information of the battery pack through a communication connection with the battery pack, and provides percentage (%) of chargeable capacity of the battery pack based on the received measured capacity information of the battery pack and a remaining capacity of the power bank.

In this case, the battery pack may include a first communication unit connected to the power bank through wired/wireless communication, a capacity information calculation unit that measures a value of open circuit voltage (OCV) of the battery pack and calculates the measured capacity of the battery pack using the measured value of OCV, an information transmitting unit that transmits the measured capacity of the battery pack calculated by the capacity information calculation unit and a capacity and state of charge (SOC) table of a storage unit to the power bank through the first communication unit, and the storage unit that stores the capacity and SOC table in which a capacity for each OCV and a SOC is recorded.

In addition, the power bank may be configured to include a second communication unit connected to the battery pack through wired/wireless communication, a remaining capacity calculation unit that calculates the remaining capacity of the power bank, an information receiving unit that receives the measured capacity information of the battery pack and the capacity and SOC table from the battery pack through the second communication unit, a chargeable range determination unit that compares a sum capacity of the measured capacity of the battery pack received by the information receiving unit and the remaining capacity of the power bank calculated by the remaining capacity calculation unit with a buffer capacity of the battery pack to determine a chargeable range of the battery pack according to the comparison result, and a display unit that externally displays the chargeable range of the battery pack determined by the chargeable range determination unit.

In this case, the chargeable range determination unit may be configured to include a capacity comparison unit that compares the sum capacity of the measured capacity of the battery pack received by the information receiving unit and the remaining capacity of the power bank calculated by the remaining capacity calculation unit with the buffer capacity the battery pack, and a chargeable capacity derivation unit that derives a chargeable capacity of the battery pack with power of the power bank according to the comparison result of the capacity comparison unit.

The chargeable capacity derivation unit derives the chargeable capacity of the battery pack as 100% when the sum capacity is equal to or greater than the buffer capacity of the battery pack as a result of the comparison of the capacity comparison unit, and extracts a SOC value corresponding to the sum capacity from the capacity and SOC table obtained from the battery pack to derive the extracted SOC value as the chargeable capacity of the battery pack when the sum capacity is less than the buffer capacity of the battery pack as a result of the comparison of the capacity comparison unit.

In addition, the present invention provides a method for charging a battery pack configured to include a communication connection step of connecting mutual data communication between a power bank and a battery pack charged by receiving charging power from the power bank, a capacity and state of charge (SOC) table obtaining step of obtaining, by the power bank, a capacity and SOC table in which a capacity for each open circuit voltage (OCV) and a SOC percentage (%) are recorded from the battery pack which is communicatively connected in the communication connection step, a measured capacity information receiving step of receiving, by the power bank, a measured capacity according to an OCV measured value of the battery pack from the battery pack which is communicatively connected in the communication connection step, a remaining capacity information calculation step of calculating, by the power bank, a remaining capacity of the power bank, a chargeable range determination step of comparing, by the power bank, a sum capacity of the calculated remaining capacity of the power bank and the measured capacity of the battery pack received from the battery pack with a buffer capacity of the battery pack to determine a chargeable range of the battery pack according to the comparison result, and an information display step of displaying, by the power bank, the determined chargeable range of the battery pack on an external display.

In this case, the chargeable range determination step may be configured to include a capacity comparison step of comparing the sum capacity of the remaining capacity of the power bank calculated in the remaining capacity information calculation step and the measured capacity of the battery pack received in the measured capacity information receiving step with the buffer capacity of the battery pack, and a chargeable capacity derivation step of deriving the chargeable capacity of the battery pack according to the comparison result in the capacity comparison step.

In this case, in the chargeable capacity derivation step, when the sum capacity of the remaining capacity of the power bank and the measured capacity of the battery pack is equal to or greater than the buffer capacity of the battery pack as the result of the comparison in the capacity comparison step, the chargeable capacity of the battery pack is derived as 100%, and when the sum capacity of the remaining capacity of the power bank and the measured capacity of the battery pack is less than the buffer capacity of the battery pack as the result of the comparison of the capacity comparison step, an SOC value corresponding to the sum capacity is extracted from the capacity and SOC table, in which a capacity for the OCV and the SOC % are recorded, obtained from the battery pack and the extracted SOC value is derived as the chargeable capacity of the battery pack.

Advantageous Effects

The present invention can improve user convenience by providing information on the chargeable capacity of the charging target (battery pack) to the external display of the power bank (auxiliary battery) based on the remaining capacity of the power bank after checking the capacity information through communication between the power bank and the charging target.

BRIEF DESCRIPTION OF THE DRAWINGS

FIG. 2 is a diagram illustrating an example of a capacity and SOC table according to the present invention.

MODE FOR CARRYING OUT THE INVENTION

Figure 1:
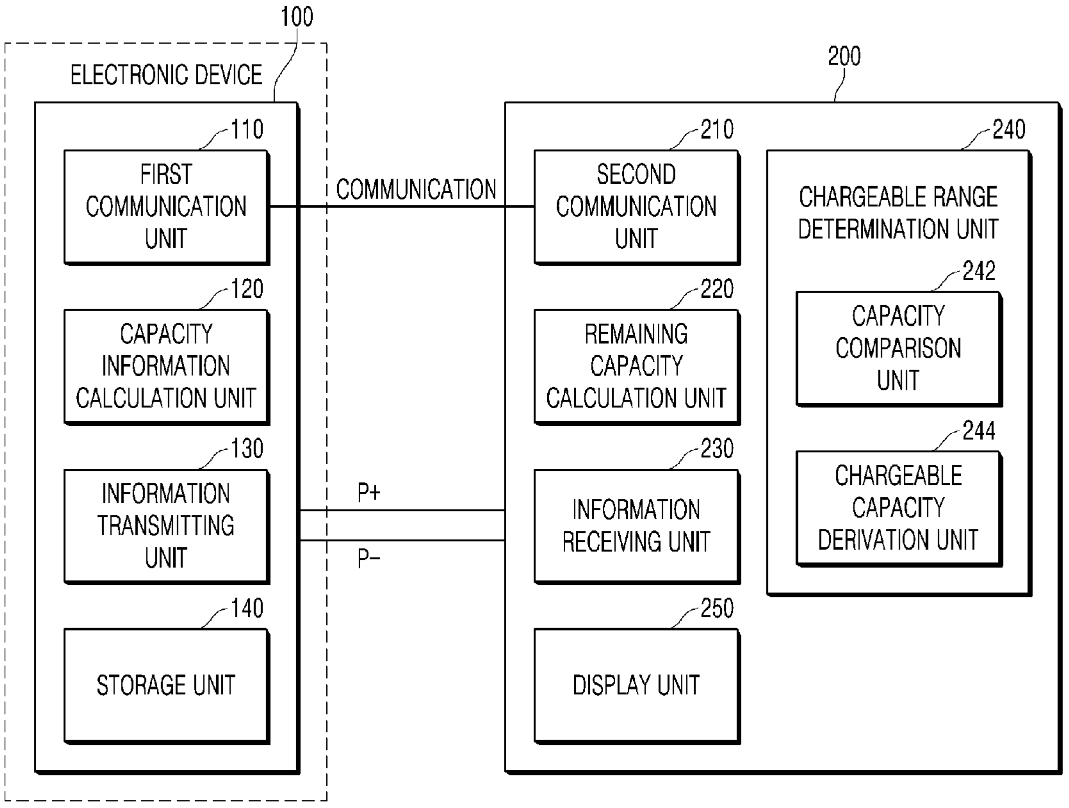
FIG. 1 is a diagram illustrating a battery pack charging system including a power bank according to the present invention.

Hereinafter, embodiments of the present invention will be described in detail with reference to the accompanying drawings so that those of ordinary skill in the art can easily carry out the present invention. However, the present invention may be embodied in various different forms and is not limited to the embodiments described herein. In order to clearly explain the present invention in the drawings, parts irrelevant to the description are omitted, and similar reference numerals are assigned to similar parts throughout the specification.

Hereinafter, the present invention will be described in detail with reference to the drawings.

1. Battery Pack Charging System According to the Present Invention

FIG. 1 is a diagram schematically illustrating a power bank having a chargeable capacity providing function according to the present invention and a battery pack charging system including the same.

Referring to FIG. 1, the battery pack charging system of the present invention is configured to include a power bank 200 and a battery pack 100 charged by receiving charging power from the power bank 200.

1.1. Battery Pack 100

The battery pack 100 is a configuration that is charged by receiving charging power from the power bank 200 through a charging terminal (not illustrated and functions as a power driving source for an electronic device (e.g., a mobile phone, a laptop, etc.) in which the battery pack 100 is mounted.

The battery pack 100 of the present invention may be configured to include the following detailed configurations.

1.1.1. First Communication Unit 110

The first communication unit 110 is a configuration for mutual data communication with the power bank (200). More specifically, it is communicatively connected to a second communication unit 210 of the power bank 200 to be described later. The data communication connection may be made in a wired or wireless connection method.

1.1.2. Capacity Information Calculation Unit 120

The capacity information calculation unit 120 measures an open circuit voltage (OCV, open circuit voltage) value of the battery pack 100, and calculates a measured capacity by using the measured OCV value.

A known technique is used in calculating the measured capacity according to the OCV measured value.

1.1.3. Information Transmitting Unit 130

The information transmitting unit 130 is a configuration that transmits the measured capacity of the battery pack 100 calculated by the capacity information calculating unit 120, a capacity, and an SOC table stored in a storage unit 140 to be described later to the power bank 200 through the first communication unit 110.

1.1.4. Storage Unit 140

The storage unit 140 is a configuration that stores a capacity and SOC table in which a capacity for each open circuit voltage (OCV) and a state of charge (SOC, %) corresponding thereto is recorded, prepared in advance through an experiment.

The capacity and SOC table may be, for example, in the form of the table shown in FIG. 2.

1.2. Power Bank or Auxiliary Battery 200

The power bank or auxiliary battery 200 is a device for charging a connected electronic device (e.g., the mobile phone, laptop, etc.) (not illustrated) by applying power stored in a battery provided therein to the battery pack 100 built in the connected electronic device.

The power bank 200 of the present invention is configured to receive capacity information of the battery pack 100 through a communication connection with the battery pack 100, and provide information on a chargeable capacity of the battery pack 100 based on the received capacity information of the battery pack 100 and a remaining capacity of the power bank 200.

Such a power bank 200 includes a power bank battery, and may be configured to further include the following detailed configuration.

1.2.1. Second Communication Unit 210

The second communication unit 210 is a configuration for mutual data communication with the charging target battery pack 100 to be charged. More specifically, it is communicatively connected to the first communication unit 110 of the battery pack 100 described above. The data communication connection may be made in a wired or wireless connection method.

1.2.2. Remaining Capacity Calculation Unit 220

The remaining capacity calculation unit 220 is a configuration that calculates a remaining capacity of the power bank 200, specifically, the remaining capacity of a power bank battery (not illustrated) built in the power bank 200.

A known technique is used in calculating the remaining capacity.

1.2.3. Information Receiving Unit 230

The information receiving unit 230 is a configuration that receives the measured capacity information of the battery pack 100 and the capacity SOC table from the battery pack 100 through the second communication unit 210.

1.2.4. Chargeable Range Determination Unit 240

The chargeable range determination unit is a configuration that compares a sum capacity of the measured capacity of the battery pack 100 received by the information receiving unit 230 and the remaining capacity of the power bank 200 calculated by the remaining capacity calculation unit 220 with a buffer capacity of the battery pack 100 to determine a chargeable range of the battery pack 100 with the power of the power bank 200 according to the comparison result.

The chargeable range determination unit 240 may be configured to include the following detailed configuration.

a. Capacity Comparison Unit 242

The capacity comparison unit 242 is a configuration that compares the sum capacity of the measured capacity of the battery pack 100 received by the information receiving unit 230 and the remaining capacity of the power bank 200 calculated by the remaining capacity calculation unit 220 with the buffer capacity of the battery pack 100.

b. Chargeable Capacity Derivation Unit 244

The chargeable capacity derivation unit 244 is a configuration that derives the chargeable capacity of the battery pack 100 with the power of the power bank 200 according to the comparison result of the capacity comparison unit 242.

Specifically, as a result of the comparison, when the sum capacity is equal to or greater than the buffer capacity of the battery pack 100, the chargeable capacity of the battery pack 100 may be derived as 100%.

On the other hand, as a result of the comparison, when the sum capacity is less than the buffer capacity of the battery pack 100, an SOC value corresponding to the sum capacity may be extracted from the capacity and SOC table in which the capacity for each OCV from the battery pack 100 and the SOC (%) is recorded from the battery pack 100, and the extracted SOC value (%) may be derived as the chargeable capacity of the battery pack.

For example, when described with reference to the table of FIG. 2, if the measured capacity of the battery pack 100 is 6 Ah and that of the power bank 200 is 3 Ah, the sum capacity of the capacity of the battery pack and the capacity of the power bank is 9 Ah. In this case, since the sum capacity is less than the buffer capacity 10 Ah of the battery pack, 90%, which is an SOC value corresponding to 9 Ah, is derived from the capacity and SOC table as shown in the table of FIG. 2, and this is derived as the chargeable capacity of the battery pack 100.

1.2.5. Display Unit 250

The display unit 250 is a configuration that displays the chargeable range of the battery pack 100 determined by the chargeable range determination unit 240 so that the user can check the chargeable range.

More specifically, when the chargeable capacity derived from the chargeable capacity derivation unit 244 of the chargeable range determination unit 240 is 90%, the display unit displays it externally. The display unit of the present invention may include a first display unit displaying the remaining capacity of the power bank and a second display unit that numerically displays how much the battery pack 100, that is, a counterpart to be charged, can be charged.

Such configurations of the power bank 200 may be implemented in a battery management system (BMS) of the power bank 200.

2. Battery Pack Charging Method According to the Present Invention

Figure 3:
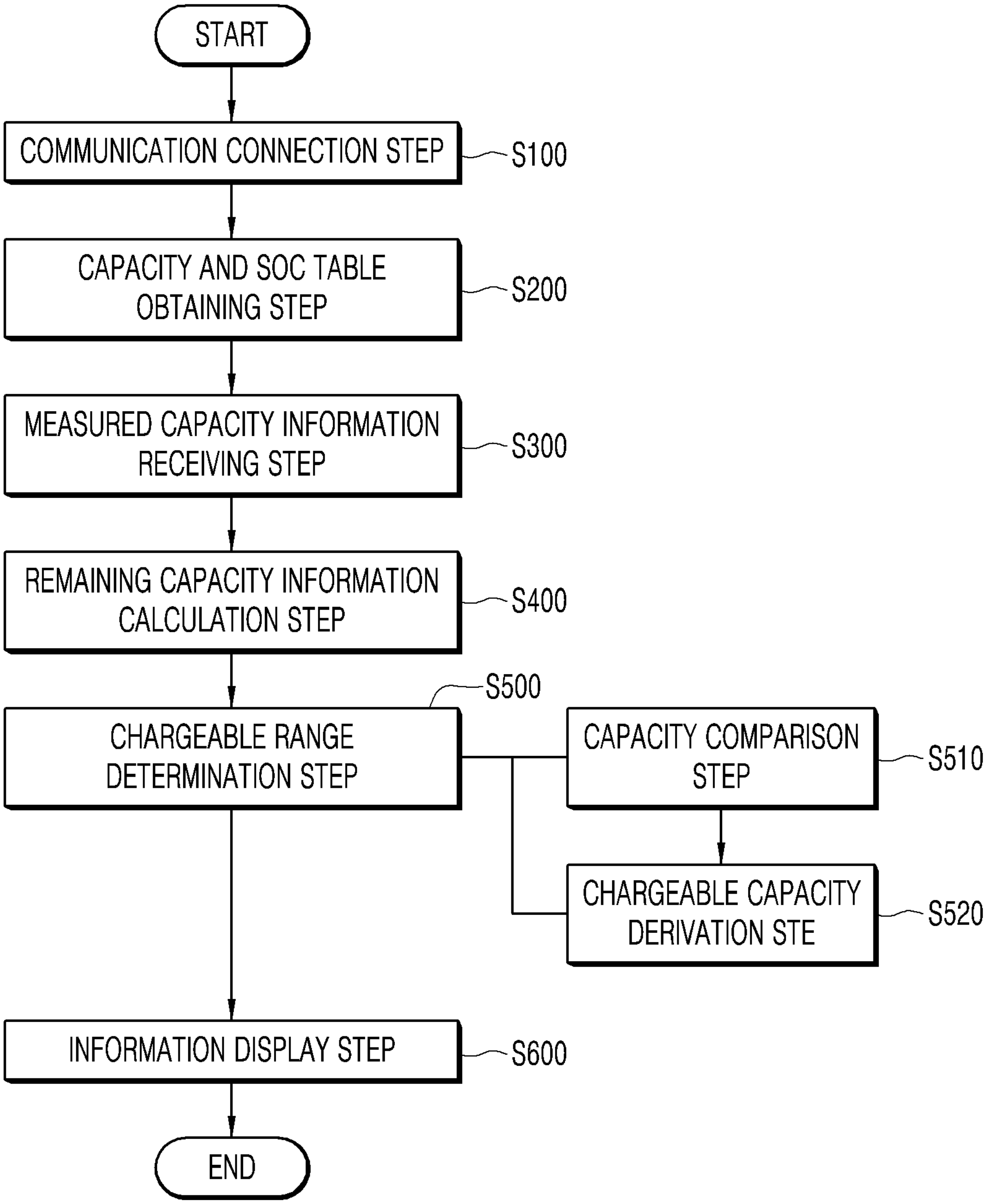
FIG. 3 is a diagram illustrating a method for charging a battery pack with the power bank according to the present invention.

FIG. 3 is a diagram illustrating a method of charging the battery pack with the power bank having the function of providing a chargeable range of the battery pack according to the present invention.

Referring to FIG. 3, the method of the present invention may be configured to include the following steps.

2.1. Communication Connection Step S100

The communication connection step S100 is a step of connecting data communication between the power bank or the auxiliary battery 200 and the battery pack 100 charged by receiving charging power from the power bank 200.

The data communication connection may be made in a wired or wireless connection method.

2.2. Capacity and SOC Table Obtaining Step S200

The capacity and SOC table obtaining step S200 is a step of obtaining, by the power bank 200, a capacity and SOC table in which a capacity for each open circuit voltage (OCV) and SOC (%) are recorded from the battery pack 100 which is communicatively connected in the communication connection step S100.

Here, the capacity and SOC table may be, for example, in the form of a table as shown in FIG. 2.

2.3. Measured Capacity Information Receiving Step S300

The measured capacity information receiving step S300 is a step of receiving, by the power bank 200, a measured capacity according to an OCV measurement value of the battery pack 100 from the battery pack which is communicatively connected.

Here, in calculating the measured capacity by the battery pack 100, the open circuit voltage (OCV) value of the battery pack 100 is measured and the measured capacity is calculated using the measured OCV value.

A known technique is used in calculating the measured capacity according to the OCV measured value.

2.4. Remaining Capacity Information Calculation Step S400

The remaining capacity information calculation step S400 is a step of measuring/calculating the remaining capacity of the power bank 200. More specifically, the remaining capacity of the battery (not illustrated) built in the power bank 200 is calculated.

A known technique is used in calculating the remaining capacity.

2.5. Chargeable Range Determination Step S500

The chargeable range determination step S500 is a step of comparing, by the power bank 200, a sum capacity of the calculated remaining capacity of the power bank 200 and the measured capacity received from the battery pack 100 with a buffer capacity of the battery pack 100 to determine a chargeable range of the battery pack with the power of the power bank 200 according to the comparison result.

This chargeable range determination step (S500) may be configured to include the following detailed steps.

2.5.1. Capacity Comparison Step S510

The capacity comparison step S510 is a step of comparing the sum of the remaining capacity of the power bank 200 calculated in the remaining capacity information calculation step S400 and the measured capacity of the battery pack 100 received in the measured capacity information receiving step S300 with the buffer capacity of the battery pack 100.

2.5.2. Chargeable Capacity Derivation Step S520

In the chargeable capacity derivation step S520, the chargeable capacity of the battery pack 100 is derived with the power of the power bank 200 according to the comparison result of the capacity comparison step S510.

Specifically, when the sum of the remaining capacity of the power bank 200 and the measured capacity of the battery pack 100 is equal to or greater than the buffer capacity of the battery pack as the result of the comparison in the capacity comparison step S510, the chargeable capacity of the battery pack 100 may be derived as 100%.

On the other hand, when the sum capacity of the remaining capacity of the power bank 200 and the measured capacity of the battery pack 100 is less than the buffer capacity of the battery pack as the result of the comparison of the capacity comparison step S510, an SOC value corresponding to the sum capacity may be extracted from the capacity and SOC table, in which the capacity for each OCV and the SOC (%) are recorded, obtained from the battery pack 100, and the extracted SOC value (%) may be derived as the chargeable capacity of the battery pack 100.

For example, when described with reference to the table of FIG. 2, if the measured capacity of the battery pack 100 is 6 Ah and that of the power bank 200 is 3 Ah, the sum capacity of the capacity of the battery pack and the capacity of the power bank is 9 Ah. In this case, since the sum capacity is less than the buffer capacity 10 Ah of the battery pack, 90%, which is an SOC value corresponding to 9 Ah, is derived from the capacity and SOC table as shown in the table of FIG. 2, and this is derived as the chargeable capacity of the battery pack 100.

2.6. Information Display Step S600

The information display step S600 is a step of displaying the chargeable capacity value (%) derived in the chargeable capacity derivation step S520 of the chargeable range determination step S500 on an external display 250 provided in the power bank 200.

In this way, information on how far the battery pack can be charged based the remaining capacity of the power bank and the measured capacity of the battery pack through communication between the power bank (auxiliary battery) and the battery pack built into the charging counterpart (electronic device) is displayed and provided to the user, thereby capable of increasing convenience and satisfaction with use of the user.

Meanwhile, although the technical idea of the present invention has been described in detail according to the above embodiments, it should be noted that the above embodiments are for description and not for limitation. In addition, those skilled in the art will understand that various embodiments are possible within the scope of the technical spirit of the present invention.

Although the power bank having a function of providing a chargeable range of a battery pack, the battery pack charging system including the same, and the method therefor have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A battery pack charging system comprising:

a power bank and a battery pack configured to charge by receiving charging power from the power bank, wherein the power bank and the battery pack each comprise a communication unit for mutual data communication, the power bank further comprises a battery management system (BMS), the BMS of the power bank is configured to receive measured capacity information of the battery pack through a communication connection with the battery pack, and provide a chargeable capacity of the battery pack based on the received measured capacity information of the battery pack and a remaining capacity of the power bank, the chargeable capacity of the battery pack is based on a sum capacity of a measured capacity of the battery pack and the remaining capacity of the power bank with a buffer capacity of the battery pack, and the power bank is configured to charge the battery pack based on the of chargeable capacity of the battery pack.

2. The battery pack charging system of claim 1, wherein the battery pack comprises:

a first communication unit connected to the power bank through wired/wireless communication, a capacity information calculation unit configured to measure a value of open circuit voltage (OCV) of the battery pack and calculate the measured capacity of the battery pack using the measured value of OCV, an information transmitting unit configured to transmit the measured capacity of the battery pack calculated by the capacity information calculation unit and a capacity and state of charge (SOC) table of a storage unit to the power bank through the first communication unit, and the storage unit configured to store the capacity and SOC table in which a capacity for each OCV and a SOC are recorded.

3. The battery pack charging system of claim 2, wherein the power bank comprises:

a second communication unit connected to the battery pack through wired/wireless communication, a remaining capacity calculation unit configured to calculate the remaining capacity of the power bank, an information receiving unit configured to receive the measured capacity information of the battery pack and the capacity and SOC table from the battery pack through the second communication unit, a chargeable range determination unit configured to compare a sum capacity of the measured capacity of the battery pack received by the information receiving unit and the remaining capacity of the power bank calculated by the remaining capacity calculation unit with the buffer capacity of the battery pack to determine a chargeable range of the battery pack according to a comparison result, and a display unit configured to externally display the chargeable range of the battery pack determined by the chargeable range determination unit.

4. The battery pack charging system of claim 3, wherein the chargeable range determination unit further includes:

a capacity comparison unit configured to compare the sum capacity of the measured capacity of the battery pack received by the information receiving unit and the remaining capacity of the power bank calculated by the remaining capacity calculation unit with the buffer capacity the battery pack, and a chargeable capacity derivation unit configured to derive a chargeable capacity of the battery pack with power of the power bank according to a comparison result of the capacity comparison unit.

5. The battery pack charging system of claim 4, wherein the chargeable capacity derivation unit is configured to derive the chargeable capacity of the battery pack as 100% SOC when the sum capacity is equal to or greater than the buffer capacity of the battery pack as a result of the comparison of the capacity comparison unit.

6. The battery pack charging system of claim 4, wherein the chargeable capacity derivation unit is configured to extract a SOC value corresponding to the sum capacity from the capacity and SOC table obtained from the battery pack to derive the extracted SOC value as the chargeable capacity of the battery pack, when the sum capacity is less than the buffer capacity of the battery pack as a result of the comparison of the capacity comparison unit.

7. A method for charging a battery pack, the method comprising:

connecting mutual data communication between a power bank and the battery pack charged by receiving charging power from the power bank;

obtaining, by the power bank, a capacity and state of charge (SOC) table, in which a capacity for each open circuit voltage (OCV) and a SOC percentage (%) are recorded, from the battery pack which is communicatively connected in the connecting mutual data communication;

receiving, by the power bank, a measured capacity according to an OCV measured value of the battery pack from the battery pack which is communicatively connected in the connecting mutual data communication;

calculating, by the power bank, a remaining capacity of the power bank;

comparing, by the power bank, a sum capacity of the calculated remaining capacity of the power bank and the measured capacity of the battery pack received from the battery pack with a buffer capacity of the battery pack to determine a chargeable range of the battery pack according to a comparison result;

displaying, by the power bank, the determined chargeable range of the battery pack on an external display; and charging the battery pack based on the chargeable range.

8. The method of claim 7, wherein the comparing, by the power bank, the sum capacity further includes:

comparing a sum capacity of the remaining capacity of the power bank calculated in the calculating, by the power bank, the remaining capacity of the power bank and the measured capacity of the battery pack received in the receiving, by the power bank, the measured capacity with the buffer capacity of the battery pack, and deriving a chargeable capacity of the battery pack according to the comparison result in the comparing the sum capacity.

9. The method of claim 8, wherein in the deriving the chargeable capacity of the battery pack, when the sum capacity of the remaining capacity of the power bank and the measured capacity of the battery pack is equal to or greater than the buffer capacity of the battery pack as the result of the comparison in the comparing the sum capacity, the chargeable capacity of the battery pack is derived as 100%.

10. The method of claim 8, wherein in the deriving the chargeable capacity of the battery pack, when the sum capacity of the remaining capacity of the power bank and the measured capacity of the battery pack is less than the buffer capacity of the battery pack as the result of the comparison of the comparing the sum capacity, an SOC value corresponding to the sum capacity is extracted from the capacity and SOC table, in which the capacity for the OCV and the SOC % are recorded, obtained from the battery pack and the extracted SOC value is derived as the chargeable capacity of the battery pack.

11. A power bank comprising:

a power bank battery;

a communication unit connected to a charging target battery pack to be charged through wired/wireless communication;

a remaining capacity calculation unit configured to calculate a remaining capacity of the power bank battery;

an information receiving unit configured to receive measured capacity information of the charging target battery pack and a capacity and a state of charge (SOC) table from the charging target battery pack through the communication unit;

a chargeable range determination unit configured to compare a sum capacity of the measured capacity of the charging target battery pack received by the information receiving unit and the remaining capacity of the power bank calculated by the remaining capacity calculation unit with a buffer capacity of the charging target battery pack to determine a chargeable range of the charging target battery pack according to a comparison result; and a display unit configured to externally display the chargeable range of the charging target battery pack determined by the chargeable range determination unit, wherein the charging target battery pack is configured to be charged based on the chargeable range.

12. The power bank of claim 11, wherein the chargeable range determination unit further includes:

a capacity comparison unit configured to compare the sum capacity of the measured capacity of the charging target battery pack received by the information receiving unit and the remaining capacity of the power bank calculated by the remaining capacity calculation unit with the buffer capacity of the charging target battery pack, and a chargeable capacity derivation unit configured to derive a chargeable capacity of the charging target battery pack with power of the power bank according to a comparison result of the capacity comparison unit.

13. The power bank of claim 12, wherein the chargeable capacity derivation unit is configured to:

derive the chargeable capacity of the charging target battery pack as 100% when the sum capacity is equal to or greater than the buffer capacity of the charging target battery pack as a result of the comparison of the capacity comparison unit, and extract an SOC value corresponding to the sum capacity from the capacity and SOC table obtained from the charging target battery pack to derive the extracted SOC value as the chargeable capacity of the charging target battery pack, when the sum capacity is less than the buffer capacity of the charging target battery pack as a result of the comparison of the capacity comparison unit.

14. The power bank of claim 13, wherein the display unit is configured to display a number of the extracted SOC value.

15. The battery pack charging system of claim 1, wherein the buffer capacity corresponds to a full charge level of the battery pack.

16. The battery pack charging system of claim 1, wherein the power bank is configured to adjust a charging current or a charging voltage supplied to the battery pack based on the chargeable capacity, and stop supplying the charging power when the sum capacity reaches the buffer capacity.

17. The battery pack charging system of claim 1, wherein the buffer capacity is a preset value stored in the battery pack to prevent overcharging, and is transmitted from the battery pack to the power bank via the communication connection.

18. The battery pack charging system of claim 1, wherein the BMS of the power bank is configured to request the measured capacity information from the battery pack upon detecting a connection with the battery pack, and perform the providing of the chargeable capacity in response to receiving the measured capacity information.

19. The battery pack charging system of claim 1, wherein the power bank further comprises a display unit, and the BMS is configured to control the display unit to visually indicate the chargeable capacity to a user before initiating charging of the battery pack.

* * * * *